(12) United States Patent
Umeki et al.

(10) Patent No.: US 8,018,126 B2
(45) Date of Patent: Sep. 13, 2011

(54) PIEZOELECTRIC DEVICES EXHIBITING REDUCED CI DEGRADATION

(75) Inventors: Mitoshi Umeki, Saitama (JP); Takefumi Saito, Saitama (JP); Ryoichi Ichikawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 12/859,210

(22) Filed: Aug. 18, 2010

(65) Prior Publication Data
US 2011/0062826 A1 Mar. 17, 2011

(30) Foreign Application Priority Data

Sep. 16, 2009 (JP) ................................ 2009-213958
Mar. 25, 2010 (JP) ................................ 2010-069441

(51) Int. Cl.
*H01L 41/08* (2006.01)
(52) U.S. Cl. ........................................ 310/344; 310/370
(58) Field of Classification Search .......... 310/341–344, 310/370
See application file for complete search history.

(56) References Cited

U.S. PATENT DOCUMENTS

| | | | | |
|---|---|---|---|---|
| 4,362,961 A | * | 12/1982 | Gerber | 310/370 |
| 5,925,973 A | * | 7/1999 | Eda et al. | 310/348 |
| 6,407,485 B1 | * | 6/2002 | Aratake | 310/344 |
| 6,606,772 B1 | * | 8/2003 | Nohara et al. | 29/25.35 |
| 7,589,458 B2 | * | 9/2009 | Aratake | 310/370 |
| 7,602,107 B2 | * | 10/2009 | Moriya et al. | 310/348 |
| 7,876,029 B2 | * | 1/2011 | Matsugi | 310/348 |
| 7,932,662 B2 | * | 4/2011 | Saito | 310/344 |

FOREIGN PATENT DOCUMENTS

JP 2007-306068 11/2007

* cited by examiner

*Primary Examiner* — Mark Budd
(74) *Attorney, Agent, or Firm* — Klarquist Sparkman, LLP (57) ABSTRACT

Surface-mounted piezoelectric devices are disclosed that include a package having a base and a lid made of a piezoelectric material or of glass. The package defines an internal cavity containing a tuning-fork type crystal vibrating piece having a pair of vibrating arms. The volume of the cavity is at least twelve times the volume of the pair of vibrating arms. Piezoelectric devices having these characteristics exhibit reduced CI degradation.

16 Claims, 7 Drawing Sheets

PIEZOELECTRIC DEVICES EXHIBITING REDUCED CI DEGRADATION

CROSS-REFERENCE TO RELATED APPLICATION

This application claims priority to and the benefit of Japan Patent Application No. 2009-213958, filed on Sep. 16, 2009, and Japan Patent Application No. 2010-069441, filed on Mar. 25, 2010, in the Japan Patent Office, the disclosures of which are incorporated herein by reference in their respective entireties.

FIELD

This disclosure relates to, inter alia, piezoelectric devices comprising a piezoelectric vibrating piece made of a piezoelectric crystal material, such as crystal, lithium niobate, or other suitable material.

DESCRIPTION OF THE RELATED ART

In many types of electronic devices, piezoelectric crystal units including piezoelectric vibrating pieces are used as a clock sources in the electronic circuits of the devices. Also used in certain devices are piezoelectric resonators including piezoelectric vibrating pieces and oscillation circuits. Especially nowadays, piezoelectric crystal units and piezoelectric resonators must be increasingly miniaturized and/or provided with a thinner or smaller profile to be accommodated in electronic devices. Also, since many electronic devices must be usable in a wide range of temperatures and other environmental stresses, piezoelectric crystal units and piezoelectric resonators used in such devices for must provide oscillations at stable frequencies, regardless of the prevailing environment condition.

SMDs (surface-mounted devices) comprising-tuning fork type crystal units must increasingly be miniaturized. A tuning-fork type piezoelectric crystal unit comprises a ceramic package made from a green sheet, as described in Japan Unexamined Patent Application No. 2007-306068. The package also comprises a piezoelectric body or glass as described in US 2009/0174286 A1. In addition to miniaturization, packages made of piezoelectric bodies or glass must be suitable for mass-production so that they can be manufactured in sufficiently large quantities to lowering the per-item manufacturing cost.

Unfortunately, piezoelectric crystal units and piezoelectric resonators having packages made of piezoelectric bodies or glass are inferior in the temperature characteristics of their CI values, compared to units in pages made of a ceramic material.

SUMMARY

The problem summarized above is addressed by piezoelectric devices having packages made of piezoelectric bodies or glass. The subject devices also exhibit CI values that less than a target limit, even in conditions of rather large temperature changes.

According to a first aspect, piezoelectric devices of the surface-mounted type are provided. An exemplary embodiment of such a device comprises a package comprising a base and a lid made of a piezoelectric body or glass. The base and lid define a cavity therebetween that is occupied by a tuning-fork type piezoelectric vibrating piece having a pair of vibrating arms. The volume of the cavity is at least equal to twelve times the volume of the pair of vibrating arms. For example, the length and width of the exterior wall of the base and the lid are 2.0 mm and 1.2 mm, respectively. The interior wall of the cavity has a rectilinear shape, wherein the length, width, and depth of the interior wall are less than or equal to 1.9 mm, 1.1 mm, and more than 0.12 mm, respectively.

The interior wall of the cavity desirably has a planar surface facing a main surface of the tuning-fork type piezoelectric vibrating piece. The planar surface of the cavity desirably has a concavity. Multiple concavities can be formed on the interior wall of the cavity. In other embodiments the interior wall of the cavity has a dome-like concavity facing the main surface of the tuning-fork type piezoelectric vibrating piece.

The piezoelectric device also desirably comprises a frame coupled to and surrounding the tuning-fork type piezoelectric vibrating piece. In such embodiments the piezoelectric device is formed by sandwiching together the frame, the lid, and the base, with the frame between the lid and base, and with the lid, frame, and base being bonded together.

The pair of vibrating arms desirably is thinner than the frame.

SMD tuning-fork type crystal units as disclosed herein exhibit CI values that are substantially less than previous threshold values, even when exposed to temperature changes.

DETAILED DESCRIPTION

Representative embodiments are described below with reference to the accompanying figures. In the following discussion, crystal units comprising a tuning-fork type crystal vibrating piece, used as a piezoelectric device, are used as discussion examples.

First Embodiment of Crystal Unit

Figure 1A:
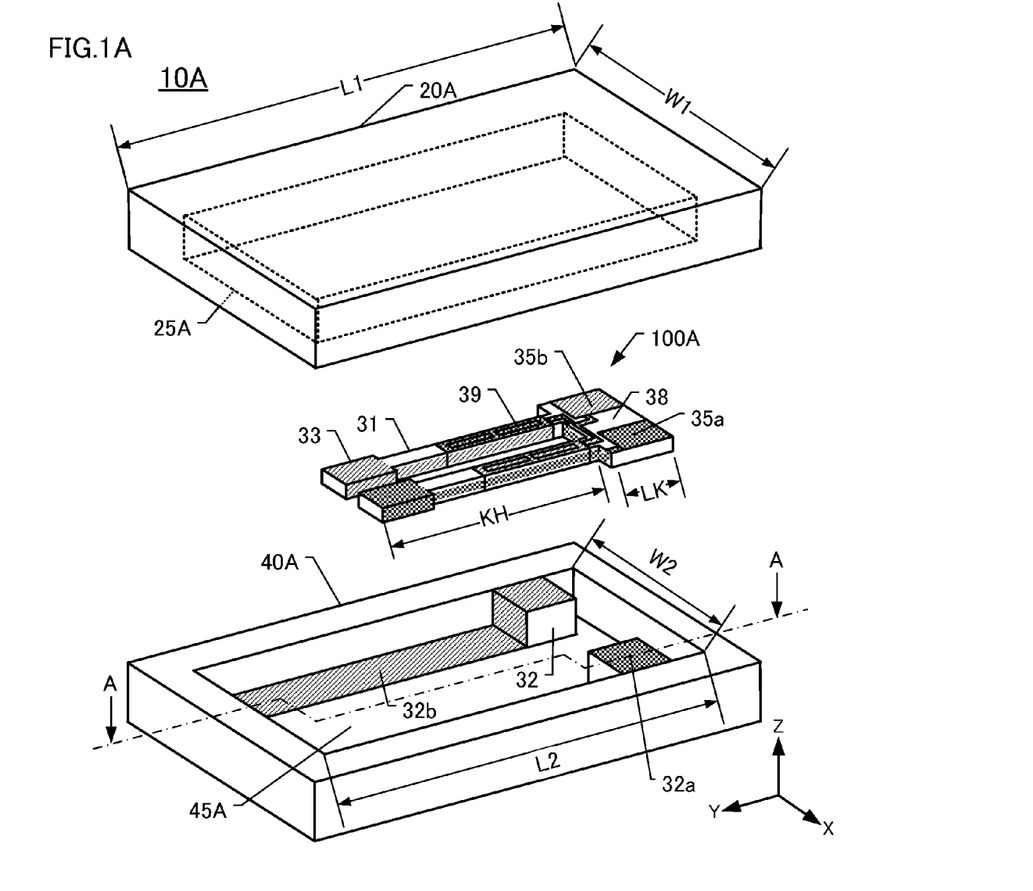
FIG. 1A is a perspective exploded view of a first embodiment of a crystal unit.
Figure 1B:
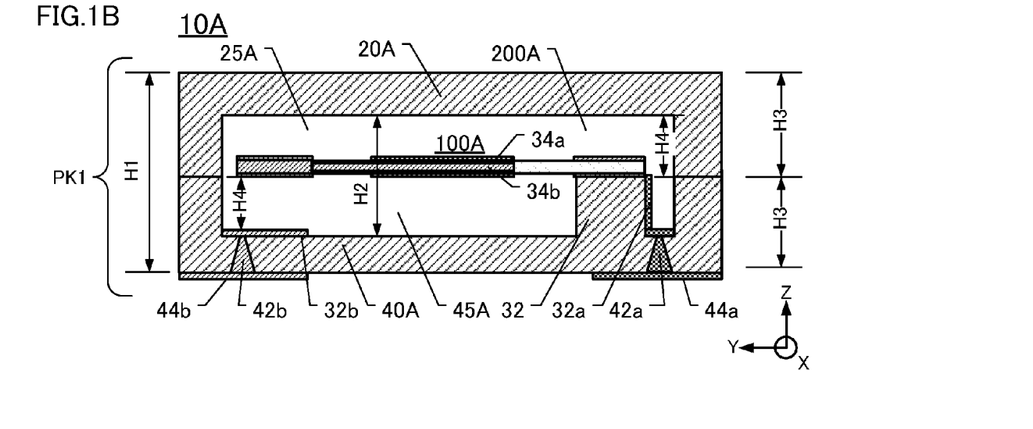
FIG. 1B is a cross-sectional view along the line A-A in FIG. 1A.

FIG. 1A is a perspective exploded view of this embodiment of a crystal unit 10A. FIG. 1B is a cross-sectional view along the line A-A in FIG. 1A. The crystal unit 10A includes a tuning-fork type crystal vibrating piece 100A. For discussion purposes, the plane in which the tuning-fork type crystal vibrating piece 100A is mounted is the X-Y plane. The direction in which the vibrating arms 31 of this embodiment extend is the Y-axis direction, and the direction perpendicular to the X-Y plane is the Z-axis direction.

As shown in FIG. 1A, the crystal unit 10A comprises a package PK1 comprising a lid 20A and a piezoelectric base 40A. The tuning-fork type crystal vibrating piece 100A is situated inside the package PK1.

Package Configuration

An exemplary size of the crystal unit 10A is as follows: The length L1 in the Y-axis direction of the package PK1 is about 2000 μm (2.0 mm); the width W1 in the X-axis direction is about 1200 μm (1.2 mm); and the height in the Z-axis direction is about 320 μm to 420 μm.

The package PK1 defines a cavity 200A. Exemplary inside dimensions of the cavity 200A, which is rectilinear, are: the length L2 in the Y-axis direction is about 1840 μm (1.84 mm); the width W2 in the X-axis direction is about 1040 μm (1.04 mm); and the height in the Z-axis direction is about 120 μm to 260 μm.

The package PK1 comprises a lid 20A and a base 40A. The lid is made of a crystal material. The lid 20A defines a lid concavity 25A that faces (−Z direction) the base 40A. The lid concavity 25A is formed by any of sand-blasting, wet-etching, and dry-etching. Exemplary dimensions of the lid 20A are: the height H3 in the Z-axis direction is 160 μm to 210 μm; and the depth H4 (formed by etching) is about 60 μm to 130 μm.

The piezoelectric base 40A is also made of a crystal material. The base 40A defines a base concavity 45A that faces (+Z direction) the lid. The base 40A includes a pair of mounts 32 used for mounting the tuning-fork type crystal vibrating piece 100A. The base concavity 45A is formed by any of sand-blasting, wet-etching, and dry-etching. Exemplary height (Z-axis direction) H5 of the piezoelectric base 40A and pair of mounts 32 is 160 μm to 210 μm. Exemplary depth H4 of the base concavity 45A (formed by etching) is about 60 μm to 130 μm.

The reason for forming the lid 20A and base 40A of a crystal material is as follows: One of the indicators of hardness of industrial materials is the "Knoop hardness number." Higher Knoop hardness numbers denote greater hardness than lower Knoop hardness numbers. The Knoop hardness of borosilicate glass, which is commonly used for lids and bases, is 590 kg/mm$^2$, and the Knoop hardness of quartz crystal is 710 to 790 kg/mm$^2$. Thus, using crystal instead of glass for the lid 20A and for the base 40A of the crystal unit 10A provides the unit with higher degrees of hardness.

If glass is used to fabricate the lid and base, the glass must be correspondingly thicker to meet hardness specifications. But, if crystal is used instead, then a thinner profile (in the Z-axis direction) can be achieved. I.e., whenever crystal is used for making the lid and base for a crystal unit having the same degree of hardness as glass, the size of crystal unit can be correspondingly miniaturized and have a thinner profile.

Although the lid 20A and the piezoelectric base 40A have the same thickness in this embodiment, they alternatively can have different respective thicknesses. Also, in this embodiment, the lid concavity 25A and the base concavity 45A have the same height. Alternatively, these respective heights can be different.

Connecting electrodes 32a, 32b are formed on the respective upper surfaces (+Z side) of the mounts 32. The connecting electrode 32a extends in the −Y direction for electrical connection to an external electrode 44a, formed on the bottom surface (−Z surface) of the crystal unit 10A, via a through-hole electrode 42a. Similarly, the connecting electrode 32b extends in the +Y direction for electrical connection to an external electrode 44b, formed on the bottom surface (−Z surface) of the crystal unit 10A, via a through-hole electrode 42b.

After bonding the first tuning-fork type crystal vibrating piece 100A to the mounts 32, the lid 20A and the piezoelectric base 40A are bonded together by siloxane (Si—O—Si) bonding, for example. In preparation for bonding the surfaces of the lid 20A and piezoelectric base 40A are mirrored and illuminated by ultraviolet light. Then, the prepared surfaces of the lid 20a are placed in contact with corresponding prepared surfaces of the base 40A. While applying compressive pressure on the lid 20A and base 40A at a temperature of 100° C. to 250° C., siloxane bonding is achieved, producing siloxane bonds (Si—O—Si—) at mutual areas of contact.

After bonding the lid 20A and base 40A together, the through-hole electrode 42b is not yet sealed. To achieve sealing of the through-hole electrode 42b, the package PK1 is placed in a reflow furnace filled with an inert gas, such as a nitrogen gas, or in a reflow furnace under a vacuum. By placing the package PK1 in the reflow furnace, the cavity 200A is filled with an inert gas or vacuum-evacuated. Also, in this condition, the through-hole electrode 42b is sealed by, for example, gold-germanium ($Au_{12}Ge$). As the cavity 200A is being filled with an inert gas or brought under vacuum, electrodes formed on the tuning-fork type crystal vibrating piece 100A are not easily oxidized. Upon completion of these steps, fabrication of the crystal unit 10A is completed while maintaining the cavity 200A in a vacuum or inert-gas condition.

Configuration of Tuning-Fork Type Crystal Vibrating Piece

The outline profile (in X-Y plane) of the tuning-fork type crystal vibrating piece 100A is formed by etching. In a photolithography step, multiple profile patterns of the tuning-fork type crystal vibrating piece 100A are exposed on a round or square crystal wafer. From the exposed patterns, the outline profiles of the tuning-fork type crystal vibrating piece 100A are formed of a corrosion-resistant film (not shown). The corrosion-resistant film can be a layer of gold (Au) on a layer of nickel (Ni). Then, wet-etching of wafer material not protected by the corrosion-resistant film is performed using hydrofluoric acid solution as an etchant. Etching time depends on the concentration of etchant, the type of etchant, and temperature.

The pair of vibrating arms 31, extending substantially parallel to each other from a base 38, is also formed by wet-etching. At least one respective groove 39 is formed on each of the upper and lower surfaces of each vibrating arm 31. The length LK of the base 38 in the Y-axis direction is about 0.15 mm, and the length KH of each vibrating arm 31 is about 1.3 mm. The width, in the X-axis direction, of each groove 39 is about 80% of the width (in the X-axis direction) of the respective vibrating arm 31. In the depicted embodiment two grooves 39 are formed on the upper surface of each vibrating arm 31, and two grooves 39 are formed on the lower surface of each vibrating arm 31. Thus, a total of eight grooves 39 are formed on the pair of vibrating arms 31. A cross-section (in the X-Z plane) across the grooves of a vibrating arm 31 is substantially H-shaped. The grooves 39 effectively lower the CI value of the tuning-fork type crystal vibrating piece 100A. Even though, in this embodiment, four grooves 39 are formed on each vibrating arm 31, it is possible for each vibrating arm to have only one groove on each surface, making a total of two grooves per arm.

Formed on the upper surface as well as the side surfaces of each vibrating arm 31 are respective excitation electrodes 34 (34a, 34b). The excitation electrode 34a is connected to a base electrode 35a formed on the base 38, and the excitation electrode 34b is connected to a base electrode 35b formed on the base 38. The distal end of each vibrating arm 31 is wider (in the X-axis direction) than other portions of the vibrating arms. The distal ends also include respective weights 33 that enhance the oscillations of the vibrating arms 31 of the piece 100A. The excitation electrodes 34 (34a and 34b), the base electrodes 35 (35a and 35b), and the weights 33 are all formed concurrently in a photolithography step.

The base electrodes 35a, 35b are electrically connected to respective connecting electrodes 32a, 32b formed on the piezoelectric base 40A. Thus, the excitation electrodes 34a, 34b are electrically connected to external electrodes 44a, 44b, respectively. When an electrical voltage is applied to the external electrodes 44a, 44b, the tuning-fork type crystal vibrating piece 100A oscillates at a designated frequency.

Degradation of CI Values Caused by Temperature Changes

As miniaturization of tuning-fork type crystal units continues nowadays, the volume of the cavity defined by the package of the tuning-fork type crystal unit also decreases. For example, the volume of a cavity of a tuning-fork type crystal unit having exterior dimensions of 3.2 mm×1.5 mm ("3215" size) is about 0.8 cm$^3$, but the volume of the cavity of the crystal unit 10A having exterior dimensions of 2.0 mm×1.2 mm ("2012" size) is only about 0.3 cm$^3$.

Through experiments, the applicants found that, in a cavity under stable vacuum, as the cavity volume is decreased flexural side vibrations at high temperature are suppressed and CI values tend to increase. Thus, there is a possibility that, as the tuning-fork type crystal unit becomes increasingly miniaturized, the CI value more likely exceeds the upper limit of CI value (CI value standard) established as being acceptable for products. Also, the crystal unit 10A must oscillate at its designated frequency within a range of compensated temperature of −40° C. to 80° C.

The size of the cavity 200A of the crystal unit 10A is described below, with reference to Table 1.

TABLE 1

| Cavity 22 Volume | Lid Concavity 25A Depth | Base Concavity 45A Depth | Vibrating Arm 31 Volume | Bulk Ratio | CI Degradation (25 C~80 C) |
|---|---|---|---|---|---|
| 0.141 mm$^3$ | 30 μm | 30 μm | 0.0195 mm$^3$ | 7.2 | 23.6 |
| 0.234 mm$^3$ | 60 μm | 60 μm | 0.0195 mm$^3$ | 12.0 | 15.0 |
| 0.287 mm$^3$ | 75 μm | 75 μm | 0.0195 mm$^3$ | 14.7 | 11.5 |
| 0.427 mm$^3$ | 110 μm | 110 μm | 0.0195 mm$^3$ | 21.9 | 4.7 |

Table 1 lists amounts of CI degradation as functions of the bulk ratio of the volume of the cavity 22 to the volume of the vibrating arm 31. The volume $V_c$ of the cavity 22 in the table changes as the depth H4 of the lid concavity 25A and the depth H4 of the base concavity 45A change from 30 μm to 60 μm, 75 μm, and 110 μm. The volume $V_a$ of the vibrating arm 31 is the crystal volume of the tuning-fork type crystal vibrating piece 100A less the base 38. That is, the volume $V_a$ of a vibrating arm 31 includes the volume of its respective weight portion 33 and excludes the groove(s) 39 (which do not contain crystal). In this embodiment, the volume $V_a$ of each vibrating arm 21 is 0.0195 mm$^3$ and is constant.

The amount of CI degradation was determined as the crystal unit 10A experienced temperatures in the range of 25° C. to 80° C. For example, as the CI value is 52 kΩ at 25° C. and 75 kΩ at 80° C., the CI degradation is 23 kΩ. Note that, as temperature raises, the CI value of crystal unit 10A increases (i.e., the CI degrades). Thus, when the compensated temperature is in the range of −40° C. to 80° C., the CI value at 80° C. is highest (i.e., most degraded).

As shown in Table 1, if the height H2 (sum of heights of the concavity 25A and 45A, or 2×H4) of the cavity 200A is 60 μm, then the bulk ratio of $V_c/V_a=7.2$ and the degradation of CI is 23.6 kΩ. If the height H2 of the cavity 200A is 120 μm, then the bulk ratio $V_c/V_a=12.0$ and the degradation of CI is 15.0 kΩ. If the height H2 of the cavity 200A is 150 μm, then $V_c/V_a=14.7$ and the degradation of CI is 11.5 kΩ. If H2=222 μm, then $V_c/V_a=21.9$ and the degradation of CI is 4.7 kΩ. Thus, as the bulk ratio increases, degradation of CI is reduced.

Figure 2:
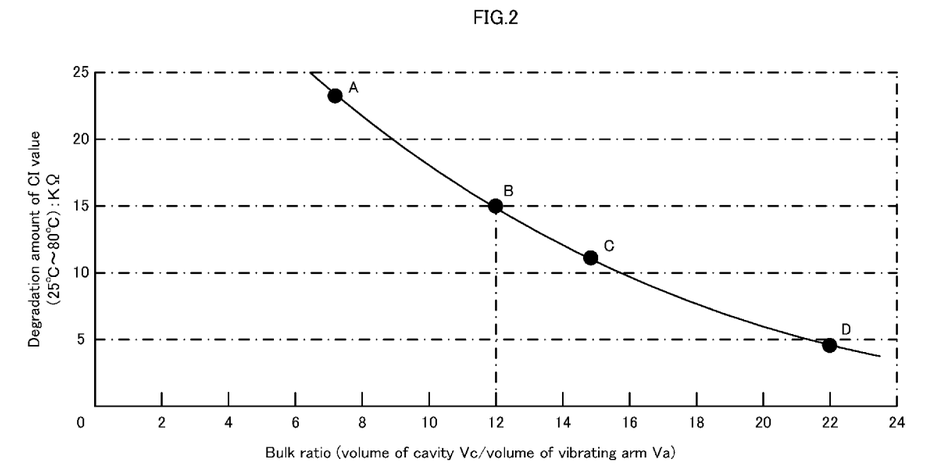
FIG. 2 is a graph showing an exemplary relationship between bulk ratio (volume of cavity $V_c$/volume of vibrating arm $V_a$) and the amount by which CI degrades.

The relationship between the bulk ratio ($V_c/V_a$) and the amount of CI degradation is shown in FIG. 2. In FIG. 2, as the bulk ratio increases, the amount of CI degradation is reduced. The crystal unit 10A exhibits a typical CI value due to the effects of vibrating-arm length and the thickness of the electrode film of the crystal unit 10A. The "typical CI value" is the CI value at 25° C. (room temperature). Although CI value degrades as temperature increases, the CI value of the crystal unit 10A must be no greater than the maximum CI value ("standard CI value") within a compensated temperature range of movement (such as −40° C. to 80° C.) that is acceptable in products. For example, whenever the standard CI value of the crystal unit 10A is 45 kΩ and the typical CI value is 30 kΩ, the CI-degradation limit is no greater than 15 kΩ. If CI degradation is greater within the compensated temperature range, then the CI value of the crystal unit 10A fails to meet the standard CI value within the compensated temperature range.

In view of the typical CI value and the standard CI value exhibited by the crystal unit 10A, it is generally desirable to establish the CI-degradation limit of the crystal unit at no greater than 15 kΩ. As shown in FIG. 2, the applicants have found the relationship between the bulk ratio and the CI-degradation amount. Whenever the bulk ratio is 12, the CI-degradation amount is 15 kΩ. As the bulk ratio increases from this value, CI-degradation amount degreases; as the bulk ratio decreases, the CI-degradation amount increases. Whenever the CI-degradation amount is no greater than 15 kΩ, $V_c$ is not less than $12 \cdot V_a$.

Second Embodiment of Crystal Unit

Figure 3A:
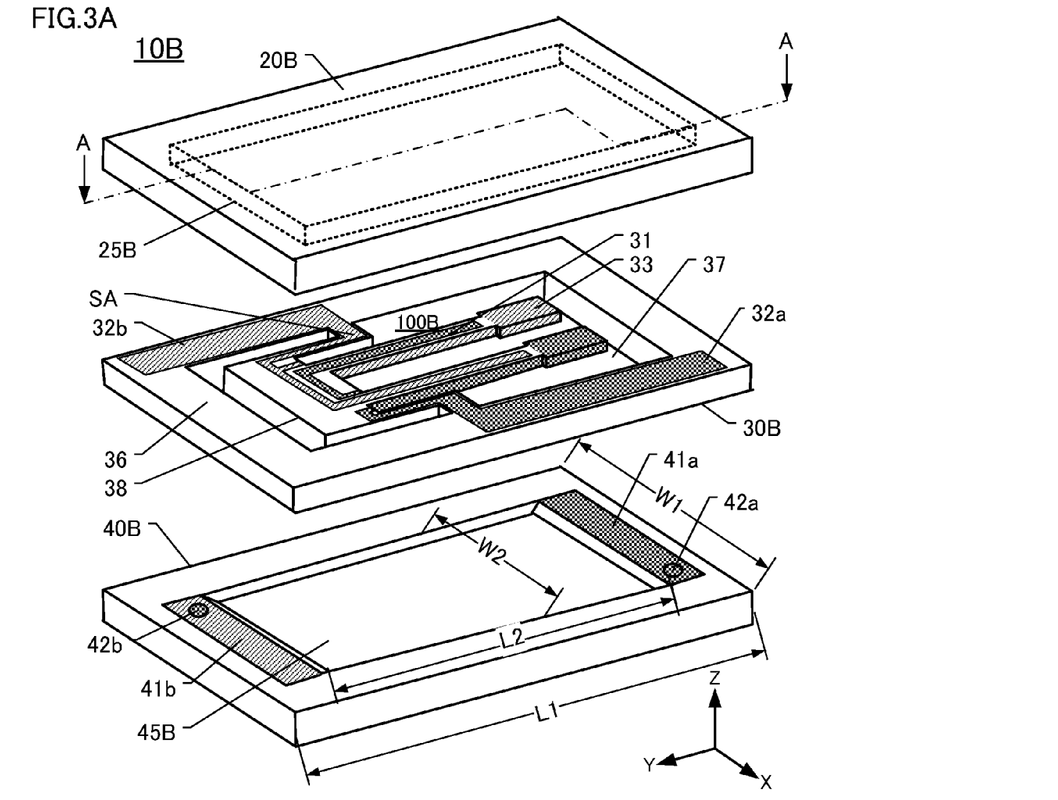
FIG. 3A is a perspective exploded view of a second embodiment of a crystal unit.
Figure 3B:
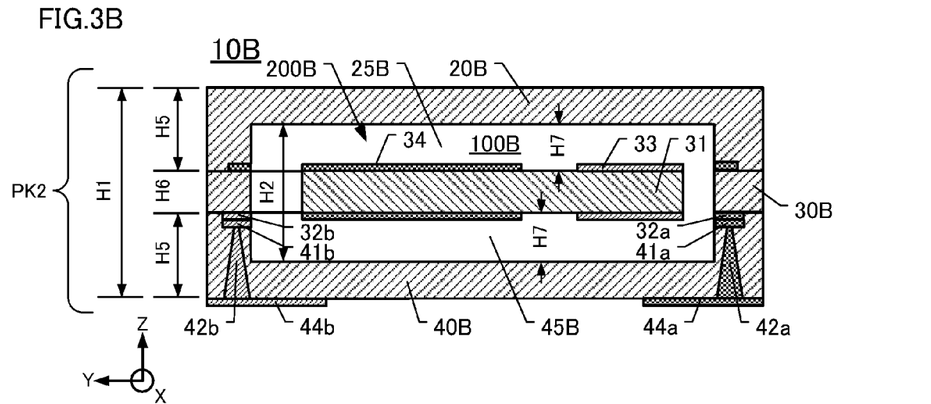
FIG. 3B is a cross-sectional view along the line A-A line in FIG. 3A.

FIG. 3A is a perspective exploded view of a second embodiment of a crystal unit 10B. FIG. 3B is a cross-sectional view along the line A-A in FIG. 3A. In this embodiment, the same reference numerals are used to denote components that are similar to respective components of the first embodiment.

As shown in FIG. 3A, the crystal unit 10B comprises a package PK2 comprising a lid 20B, a piezoelectric frame 30B, and a piezoelectric base 40B. The piezoelectric frame 30B includes a tuning-fork type piezoelectric vibrating piece 100B formed by etching.

The lid 20B, piezoelectric frame 30B, and piezoelectric base 40B are bonded together by siloxane (Si—O—Si) bonding to form a cavity 200B. Siloxane bonding is explained in the description of the first embodiment, so explanation of the method is omitted here.

Configuration of Package

The outer dimensions of the package PK2 is as follows: the length L1 in the Y-axis direction of the crystal unit 10B is about 2000 μm, and the width W1 in the X-axis direction is about 1200 μm. The height H1 in the Z-axis direction of the package PK2 is in the range of 320 μm to 440 μm. The inner dimensions of the cavity 200B of the crystal unit 10B is as follows: the length L2 in the Y-axis direction is about 1840 μm, the width W2 in the X-axis direction is about 1040 μm, and the height in the Z-axis direction is in the range of 120 μm to 260 μm.

The lid 20B is made of a crystal material. The lid 20B defines a lid concavity 25B that faces the piezoelectric frame 30B. The height H5 in the Z-axis direction of the lid 20B is in the range of 120 μm to 180 μm, and the height H7 of the lid concavity 25B (formed by etching) is in the range of 30 μm to 100 μm.

The piezoelectric base 40B is also made of a crystal material. The piezoelectric base 40B defines a base concavity 45B that faces the piezoelectric frame 30B. A first connecting electrode 41a and a second connecting electrode 41b are formed on respective ends, in the Y-direction, of the piezoelectric base 40B. A through-hole electrode 42a is formed under the first connecting electrode 41a, and a through-hole electrode 42b is formed under the second connecting electrode 41b. The height H5 in the Z-axis direction of the piezoelectric base 40B is in the range of 120 μm to 180 μm, and the height H7 on the base concavity 45B (formed by etching) is in the range of 30 μm to 100 μm.

Whenever a crystal unit is being manufactured or being attached to a printed circuit board, heat is applied to the crystal unit. If different crystal materials are used for making the lid 20B versus the piezoelectric base 40B, the interior of the crystal unit becomes stressed due to differences in thermal expansion coefficients of the two different materials. If the differences in thermal-expansion coefficients are sufficiently large, the correspondingly large stress may actually cause fracture of corners of the outer frame 36 of the piezoelectric frame 30B. Therefore, it is desirable to narrow the differences in thermal-expansion coefficients between the lid 20B and the piezoelectric base 40B, and between either of the lid and base and the piezoelectric frame 30B. It is also desirable to use a crystal material for the lid 20B and piezoelectric base 40B because, compared to a package made using glass, the difference in thermal expansion coefficient posed by the piezoelectric frame 30B can be narrowed to reduce the stress inside the crystal unit 10B. Also, use of a crystal material allows greater miniaturization or a thinner profile of the crystal unit compared to one made from glass.

In this embodiment, the lid 20B and the piezoelectric base 40B have the same height. Also, the lid concavity 25B and base concavity 45B desirably have the same depth (height). Alternatively, these height and depths can be different.

The piezoelectric frame 30B desirably is made of a crystal material (e.g., quartz crystal). The height H6 in the Z-axis direction of the piezoelectric frame 30B is in he range of 60 μm to 200 μm. The piezoelectric frame 30B includes a second tuning-fork type piezoelectric vibrating piece 100B at its center, surrounded by an outer frame portion 36. A space 37 is formed between the piece 100B and the outer frame portion 36. The tuning-fork type piezoelectric vibrating piece 100B is connected to the outer frame portion 36 through supporting arms SA extended from the base 38.

The profile and size of the tuning-fork type crystal vibrating piece 100B of this embodiment are the same as of the first embodiment. For example, the lengths of the vibrating arms 21 and of the base 38, and the thicknesses of the respective electrodes, are the same as described in the first embodiment. Hence, further description of these components is omitted.

Also in the second embodiment, it is desirable that the maximum CI degradation be no greater than 15 kΩ. Thus, the ratio of $V_c/V_a$ is adjusted accordingly so that the maximum CI-value degradation is no greater than 15 kΩ.

Referring to FIG. 2, if the bulk ratio of cavity volume $V_c$ to vibrating-arm volume $V_a$ is no greater than 12, then CI degradation is no greater than 15 kΩ. The height H6 of the piezoelectric frame 30B in the second embodiment is in the range of 60 μm to 200 μm so that the depth (height) of the lid concavity 25B or the base concavity 45B need not be formed deeper (higher). Consequently, the etching time required for forming the second lid concavity 25B or the second base concavity 45B can be reduced.

Third Embodiment of Crystal Unit

Figure 4:
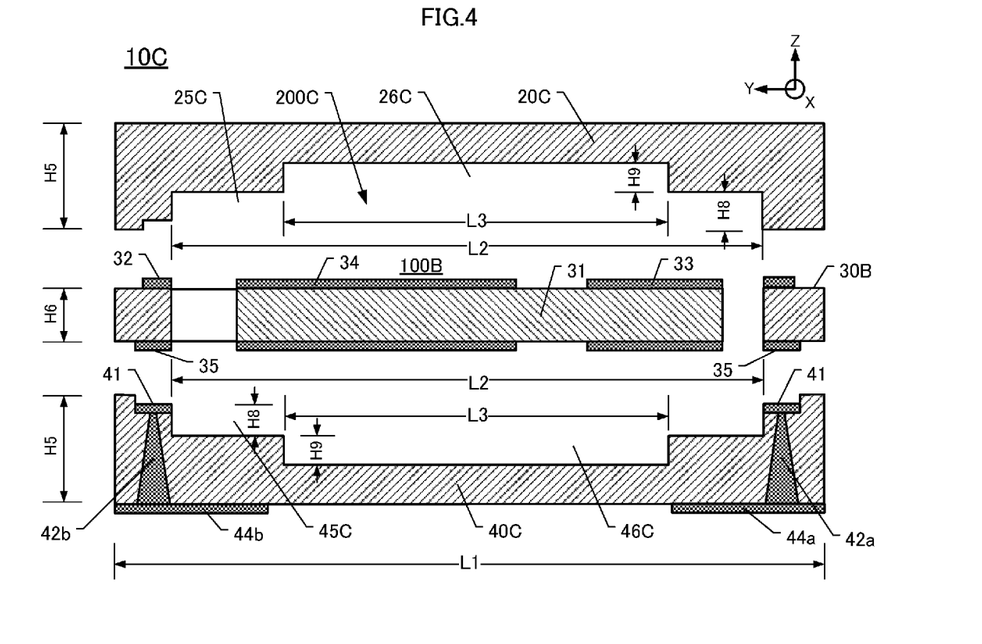
FIG. 4 is an elevational exploded view of a third embodiment of a crystal unit.

FIG. 4 is an elevational exploded view of a crystal unit 10C according to this embodiment. In this embodiment, components that are similar to respective components of the second embodiment have the same respective reference numerals and are not described further. As shown in FIG. 2, whenever the ratio of cavity volume ($V_c$) increases relative to the constant volume ($V_a$) of the vibrating arm, CI degradation is reduced. Thus, this third embodiment is a first example in which $V_c$ is increased while maintaining the same intensity and rigidity of the lid and the piezoelectric base.

The lid 20C, the piezoelectric frame 30B, and the piezoelectric base 40C of this embodiment are bonded together by siloxane (Si—O—Si) bonding, thereby forming a rectilinear cavity 200C. The method of siloxane bonding is the same as used in the first embodiment, and the piezoelectric frame 30B is the same as used in the second embodiment.

Compared to the second embodiment, the respective shapes of the lid and of the piezoelectric base in this third embodiment are different. For example, in this embodiment, a sub-concavity 26C is formed as a sub-cavity in the lid concavity 25C. Similarly, a sub-concavity 46C is formed as a sub-cavity in the base concavity 45C.

The profile size of the crystal unit 10C is the same as of the first and second embodiments. The length L1 in the Y-axis direction of the crystal unit 10C is about 2000 μm. In the cavity 200C the length L2 in the Y-axis direction of the lid concavity 25C and of the base concavity 45C is about 1840 μm. The depth (height) H8 of the lid concavity 25C and of the base concavity 45C is in the range of 10 μm to 100 μm. The length L3 in the Y-axis direction of the sub-concavity 26C and of the sub-concavity 46C is in the range of 200 μm to 1800 μm, which is shorter than L2. The depth (height) H9 in the Z-axis direction of the sub-concavity 26C and of the sub-concavity 46C is in the range of 10 μm to 100 μm. The length L3 or the depth (height) H9 of the sub-concavity 26C and of the sub-concavity 46C can be determined in view of the intensity and rigidity of the lid concavity 25C and of the base concavity 45C. The third lid concavity 25C and the third base concavity 45C do not necessarily have sizes or profiles that are equal to each other.

In the third embodiment, the bulk ratio $V_c/V_a$ is adjusted to be no less than 12 by adjusting the depth (height) H8 of the lid concavity 25C and of the base concavity 45C and the depth (height) H9 in the Z-axis direction of the sub-concavity 26C and the sub-concavity 46C. As a result, the amount by which the CI value of the crystal unit 10C degrades is less than 15 kΩ

Fourth Embodiment of Crystal Unit

Figure 5:
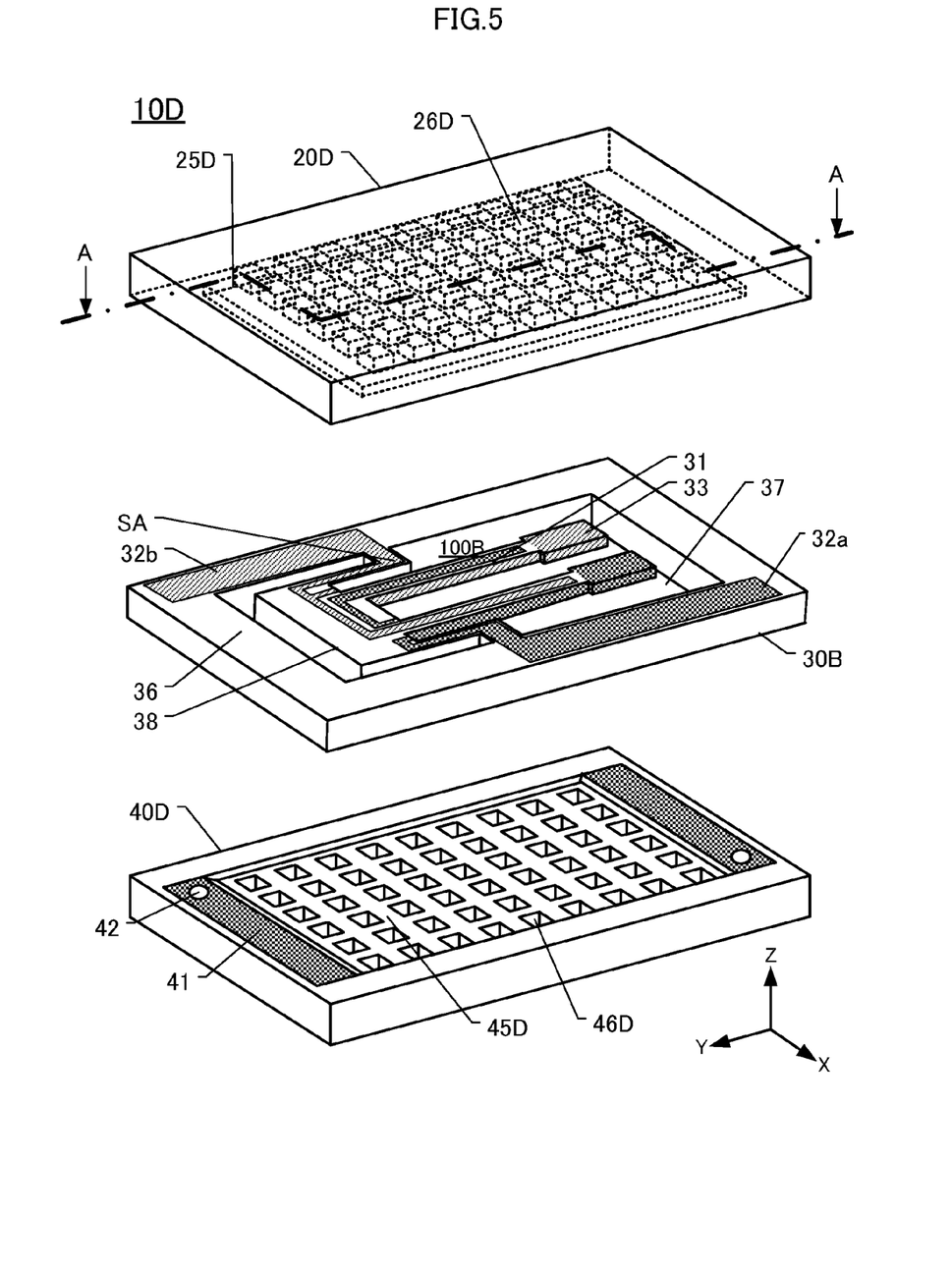
FIG. 5 is a perspective exploded view of a fourth embodiment of a crystal unit.
Figure 6:
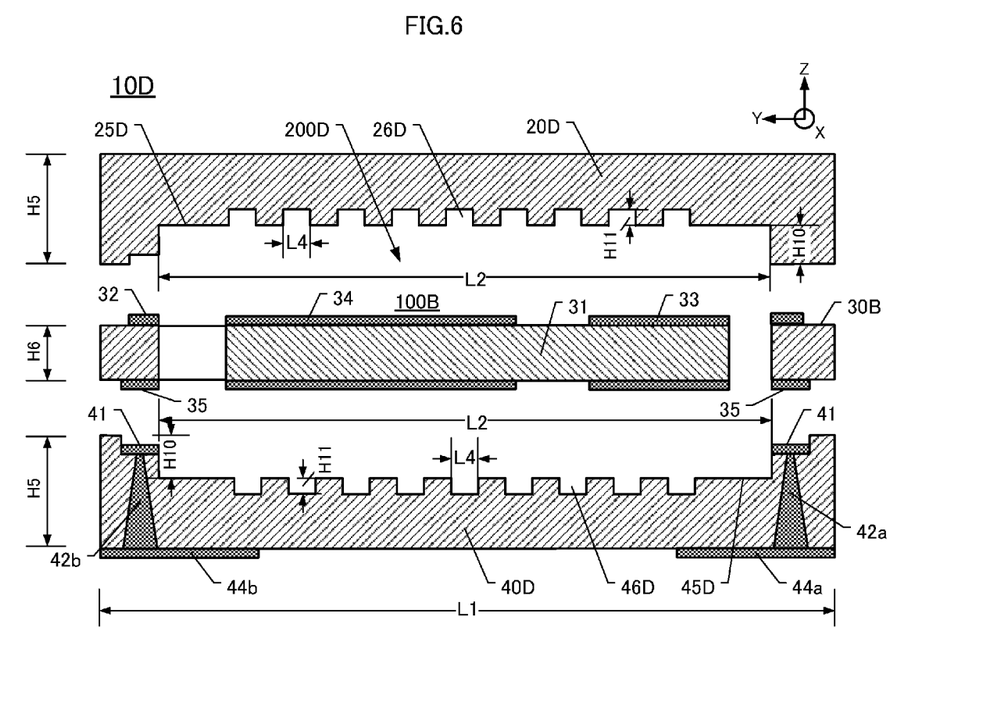
FIG. 6 is an elevational exploded view along the line A-A of in FIG. 5.

FIG. 5 is a perspective exploded view of the crystal unit 10D of this embodiment, and FIG. 6 is a cross-sectional view along the line A-A of FIG. 5. In this embodiment, components that are similar to corresponding components in the third embodiment have the same respective reference numerals and are not discussed further. As shown in FIG. 2, whenever the cavity volume $V_c$, becomes increasingly larger while holding the vibrating-arm volume $V_a$ constant, the CI degradation decreases. This fourth embodiment is second example in which $V_c$, is increased while maintaining the same intensity and rigidity of the lid and piezoelectric base.

In this embodiment a lid 20D, a piezoelectric frame 30B, and a piezoelectric base 40D are bonded together by siloxane (Si—O—Si) bonding to form a rectilinear cavity 200D. The method of siloxane bonding is the same as used in first embodiment. Also, the piezoelectric frame 30B used in this embodiment is similar to the one used in the second embodiment.

Compared to the third embodiment the respective shapes of the lid and piezoelectric base in this fourth embodiment are different. Particularly, on the lid concavity 25D are formed multiple small sub-concavities 26D. Similarly, on the fourth base concavity 45D are formed multiple small sub-concavities 46D. More specifically, FIG. 5 depicts six columns (each extending in the Y-axis direction) each containing nine small sub-concavities 26D, yielding a total of 54 small sub-concavities 26D in the lid 10D. Similarly, the base 40D has six columns (each extending in the Y-axis direction) each containing nine small sub-concavities 46D, yielding a total of 54 sub-concavities 46D in the base 40D. The number of small sub-concavities can be changed as required or desired. The cross-sectional profile of a small sub-concavity 26D or 46D is rectilinear, but alternatively can be round or polygonal.

As shown in FIG. 6, the profile size of the crystal unit 10D is the same as of the crystal unit 10C of the third embodiment. The length L1 in the Y-axis direction of the crystal unit 10D is 2000 µm. The size of the cavity 200D is such that the lengths L2 in the Y-axis direction of the lid concavity 25D and of the base concavity 45D are each about 1840 µm. The depth (height) H10 of the lid concavity 25D and of the base concavity 45D is in the range of 10 µm to 100 µm. The depth (height) H11 of the small sub-concavity 26D and of the small sub-concavity 46D is in the range of 10 µm to 100 µm. The length L4 in the Y-axis direction of the small sub-concavity 26D and of the small sub-concavity 46D is in the range of 10 µm to 50 µm. The length L4 and/or the depth (height) H11 of the small sub-concavity 26D and of the small sub-concavity 46D can be determined in view of intensity and rigidity of the lid concavity 25D and of the base concavity 45D. In a particular crystal unit 10D, the sizes and profiles of the lid concavity 25D and of the base concavity 45D are not necessarily identical. Also, in a particular crystal unit 10D the sizes and profiles of the small sub-concavity 26D and of the small sub-concavity 46D are not necessarily identical.

In the fourth embodiment, the length L4 and the height H11 of the sub-concavities 26D and 46D, the respective numbers of small sub-concavities 26D and of small sub-concavities 46D, and the bulk ratio $V_c/V_a$ are adjustable. The bulk ratio $V_c/V_a$ desirably is adjusted to be no less than 12 by adjusting the depth (height) H10 of the lid concavity 25D and the base concavity 45D. As a result, degradation of CI value exhibited by the crystal unit 10D is held to less than 15 kΩ.

In this embodiment ribs are formed between adjacent small sub-concavities 26D and between adjacent small sub-concavities 46D. This configuration provides intensity to the lid concavities 25D and 45D so that the depth (height) H11 of the small sub-concavity 26D and the small sub-concavity 46D can be formed deeper.

Fifth Embodiment of Crystal Unit

Figure 7:
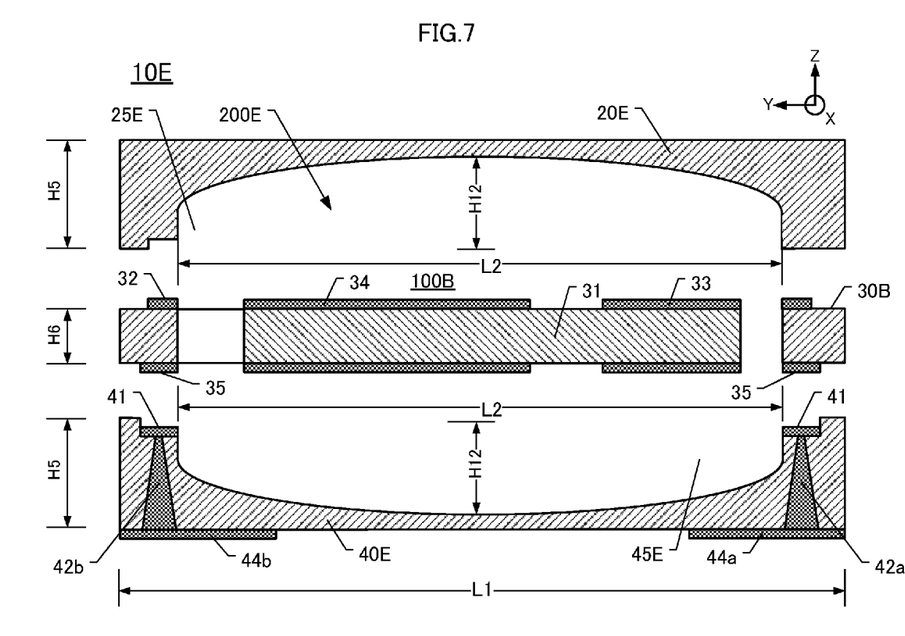
FIG. 7 is an elevational exploded view of a fifth embodiment of a crystal unit.

FIG. 7 is an elevational exploded view of a crystal unit 10E according to this embodiment. In this embodiment, components that are similar to corresponding components of the second embodiment have the same respective reference numerals and are not described further. As shown in FIG. 2, as $V_c$ increases while $V_a$ remains constant, the amount of degradation of CI value becomes less. This fifth embodiment is a third example in which $V_c$ is increased while maintaining unchanged the intensity and rigidity of the lid and of the piezoelectric base.

In this embodiment a lid 20E, piezoelectric frame 30B, and piezoelectric base 30E are bonded together by siloxane (Si—O—Si) bonding to form an internal cavity 200E. The method of siloxane bonding is the same as used in the first embodiment. Also, the piezoelectric frame 30B is the same as used in the second embodiment.

Compared to the third embodiment the shape of the lid 20E and/or the shape of piezoelectric base 40E in the fifth embodiment is different. Particularly, the lid 20E defines a dome-like concavity 25E. Also, the base 40E defines a dome-like concavity 45E.

Whenever a cross-section of the lid or piezoelectric base is rectilinear in shape, stress applied from outside of the package is concentrated at the corners. As a result, thinner regions of the lid and base that are situated over respective concavities may be easily broken because of such corners. To solve this problem, this embodiment utilizes concavities having dome-like profiles as shown in FIG. 7, or other profile having a curving line, which reduces the number of corners at which stress can otherwise concentrate. Consequently, the crystal unit 10E of this embodiment is not easily broken.

The maximum depth (height) H12 of the lid concavity 25E of the lid 20E shown in FIG. 7 is in the range of 100 µm to 160 µm. Similarly, the maximum depth (height) H12 of the base concavity 45E of the base 40E is in the range of 100 µm to 160 µm. With such a configuration, the crystal unit 10E shown in FIG. 7 maintains its intensity despite its enlarged volume of the cavity $V_c$.

The dome-like lid concavity 25E and base concavity 45E can be formed by etching, for example. Alternatively, the lid concavity 25E and base concavity 45E can be formed into their dome-like shapes by sand-blasting followed by wet-etching.

The first through fifth embodiments represent examples in which a piezoelectric material, such as quartz crystal, is used for fabricating the lid and base. Alternatively, the lid and base can be made of glass. Referring for example to the first embodiment, if glass were used for making the lid 20A and piezoelectric base 40A instead of quartz crystal, the lid and base can be bonded together by anodic bonding. Many lids and bases can be fabricated on respective single wafers that are formed into a sandwich for bonding. For example, in the second through fifth embodiments, if glass were used for making the lid 20B and piezoelectric base 40B instead of quartz crystal, the lid and base are bonded together by anodic bonding. In such an instance, anodic bonding is performed using a metal film formed on the surface of the outer frame portion 36 of the tuning-fork type crystal vibrating piece 100B of the piezoelectric frame 30B.

Although not specifically shown in a drawing, the lid and base of the third through fifth embodiments can be the lid 20A and the piezoelectric base 40A, respectively, of the first embodiment instead.

Representative embodiments are described above. It will be understood by those skilled in the art that these embodiments can be modified or changed while not departing from the spirit and scope of them and/or of the appended claims. The present invention can be applied to piezoelectric resonators having an IC installing oscillating circuit on its base in place of a piezoelectric crystal unit.

What is claimed is:
1. A surface-mounted type piezoelectric device, comprising:

a package comprising a base and a lid made of a piezoelectric or glass material, the base and lid being coupled to each other and defining an interior cavity; and a tuning-fork type piezoelectric vibrating piece mounted in the cavity, the vibrating piece comprising a pair of vibrating arms, and the vibrating arms having a volume;

the cavity having a volume that is at least twelve times the volume of the pair of vibrating arms.

2. The piezoelectric device of claim 1, wherein:

the base and lid each have an exterior surface having a length of 2.0 mm and a width of 1.2 mm;

the cavity has a rectangular-shaped interior wall having a length no greater than 1.9 mm and a width no greater than 1.1 mm; and the cavity has a depth of at least 0.12 mm.

3. The piezoelectric device of claim 2, further comprising:

a piezoelectric frame coupled to and surrounding the tuning-fork type piezoelectric vibrating piece, the frame having first and second surfaces;

wherein the piezoelectric device comprises a sandwich of the piezoelectric frame between the lid and base, the sandwich comprising the lid bonded to the first surface and the base bonded to the second surface.

4. The piezoelectric device of claim 3, wherein the pair of vibrating arms is thinner than the frame.

5. The piezoelectric device of claim 1, wherein:

the tuning-fork type piezoelectric vibrating piece has a main surface;

the cavity has a planar interior wall facing the main surface of the tuning-fork type piezoelectric vibrating piece; and the interior wall defines a concavity facing the main surface of the tuning-fork type piezoelectric vibrating piece.

6. The piezoelectric device of claim 5, further comprising:

a piezoelectric frame coupled to and surrounding the tuning-fork type piezoelectric vibrating piece, the frame having first and second surfaces;

wherein the piezoelectric device comprises a sandwich of the piezoelectric frame between the lid and base, the sandwich comprising the lid bonded to the first surface and the base bonded to the second surface.

7. The piezoelectric device of claim 6, wherein the pair of vibrating arms is thinner than the frame.

8. The piezoelectric device of claim 5, wherein the interior wall defines multiple concavities facing the tuning-fork type piezoelectric vibrating piece.

9. The piezoelectric device of claim 8, wherein the multiple concavities comprises a larger concavity defining multiple smaller concavities.

10. The piezoelectric device of claim 8, further comprising:

a piezoelectric frame coupled to and surrounding the tuning-fork type piezoelectric vibrating piece, the frame having first and second surfaces;

wherein the piezoelectric device comprises a sandwich of the piezoelectric frame between the lid and base, the sandwich comprising the lid bonded to the first surface and the base bonded to the second surface.

11. The piezoelectric device of claim 10, wherein the pair of vibrating arms is thinner than the frame.

12. The piezoelectric device of claim 1, wherein:

the tuning-fork type piezoelectric vibrating piece has a main surface;

the cavity has a planar interior wall facing the main surface of the tuning-fork type piezoelectric vibrating piece; and the interior wall defines a dome-like concavity facing the tuning-fork type piezoelectric vibrating piece.

13. The piezoelectric device of claim 12, further comprising:

a piezoelectric frame coupled to and surrounding the tuning-fork type piezoelectric vibrating piece, the frame having first and second surfaces;

wherein the piezoelectric device comprises a sandwich of the piezoelectric frame between the lid and base, the sandwich comprising the lid bonded to the first surface and the base bonded to the second surface.

14. The piezoelectric device of claim 13, wherein the pair of vibrating arms is thinner than the frame.

15. The piezoelectric device of claim 1, further comprising:

a piezoelectric frame coupled to and surrounding the tuning-fork type piezoelectric vibrating piece, the frame having first and second surfaces;

wherein the piezoelectric device comprises a sandwich of the piezoelectric frame between the lid and base, the sandwich comprising the lid bonded to the first surface and the base bonded to the second surface.

16. The piezoelectric device of claim 15, wherein the pair of vibrating arms is thinner than the frame.

* * * * *